US006993741B2

(12) United States Patent
Liebmann et al.

(10) Patent No.: US 6,993,741 B2
(45) Date of Patent: Jan. 31, 2006

(54) GENERATING MASK PATTERNS FOR ALTERNATING PHASE-SHIFT MASK LITHOGRAPHY

(75) Inventors: Lars W. Liebmann, Poughquag, NY (US); Scott J. Bukofsky, Hopewell Junction, NY (US); Ioana Graur, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 330 days.

(21) Appl. No.: 10/604,373

(22) Filed: Jul. 15, 2003

(65) Prior Publication Data

US 2005/0014074 A1 Jan. 20, 2005

(51) Int. Cl.
G06F 17/50 (2006.01)
G03C 1/00 (2006.01)
G03F 5/00 (2006.01)

(52) U.S. Cl. ............................... 716/19; 716/21; 430/5; 430/394

(58) Field of Classification Search .................. 716/19, 716/21; 430/5, 394
See application file for complete search history.

(56) References Cited

U.S. PATENT DOCUMENTS

| | | | |
|---|---|---|---|
| 5,807,649 A | | 9/1998 | Liebmann et al. |
| 5,883,813 A | * | 3/1999 | Kim et al. ..................... 716/19 |
| 6,258,493 B1 | | 7/2001 | Wang et al. |
| 6,338,922 B1 | | 1/2002 | Liebmann et al. |
| 6,493,866 B1 | * | 12/2002 | Mayhew ...................... 716/21 |
| 6,721,938 B2 | * | 4/2004 | Pierrat et al. ................. 716/19 |
| 6,733,929 B2 | * | 5/2004 | Pierrat ........................... 430/5 |
| 6,823,503 B2 | * | 11/2004 | Beaudette ..................... 716/19 |
| 6,846,596 B2 | * | 1/2005 | Wu ................................ 430/5 |
| 6,904,587 B2 | * | 6/2005 | Tsai et al. ..................... 716/19 |
| 2001/0028985 A1 | | 10/2001 | Wang et al. |
| 2002/0045136 A1 | | 4/2002 | Fritze et al. |
| 2002/0046392 A1 | * | 4/2002 | Ludwig et al. ............... 716/19 |
| 2002/0071997 A1 | | 6/2002 | Ahrens et al. |
| 2002/0081500 A1 | | 6/2002 | Cobb et al. |
| 2002/0083410 A1 | | 6/2002 | Wu et al. |
| 2002/0094492 A1 | | 6/2002 | Randall et al. |
| 2003/0014732 A1 | * | 1/2003 | Liu et al. ...................... 716/21 |
| 2003/0070155 A1 | * | 4/2003 | Wu et al. ...................... 716/19 |
| 2003/0229879 A1 | * | 12/2003 | Pierrat ......................... 716/19 |
| 2005/0081178 A1 | * | 4/2005 | Sivakumar et al. ........... 716/19 |

OTHER PUBLICATIONS

Sewell,H et al. "An Evaluation of the Dual Exposure Technique", Proceedings of the SPIE—The International Society for Optical Engineering, vol. 4344, pp. 323-333, 2001.*

* cited by examiner

Primary Examiner—Matthew Smith
Assistant Examiner—Magid Y. Dimyan
(74) Attorney, Agent, or Firm—Todd M. C. Li

(57) ABSTRACT

A method of generating patterns of a pair of photomasks from a data set defining a circuit layout to be provided on a substrate includes identifying critical segments of the circuit layout to be provided on the substrate. Block mask patterns are generated and then legalized based on the identified critical segments. Thereafter, phase mask patterns are generated, legalized and colored. The legalized block mask patterns and the legalized phase mask patterns that have been colored define features of a block mask and an alternating phase shift mask, respectively, for use in a dual exposure method for patterning features in a resist layer of a substrate.

14 Claims, 13 Drawing Sheets

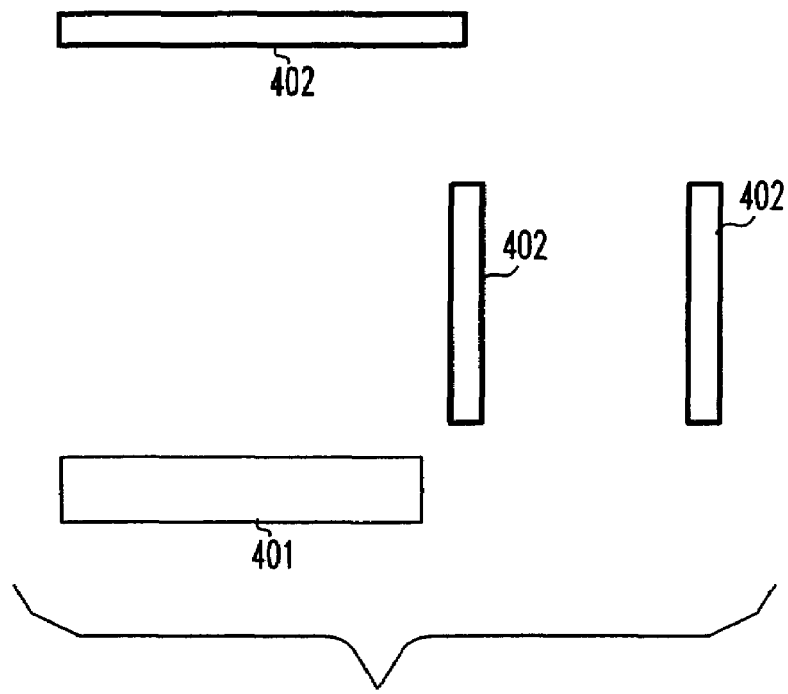
FIG. 5A *(PRIOR ART)*
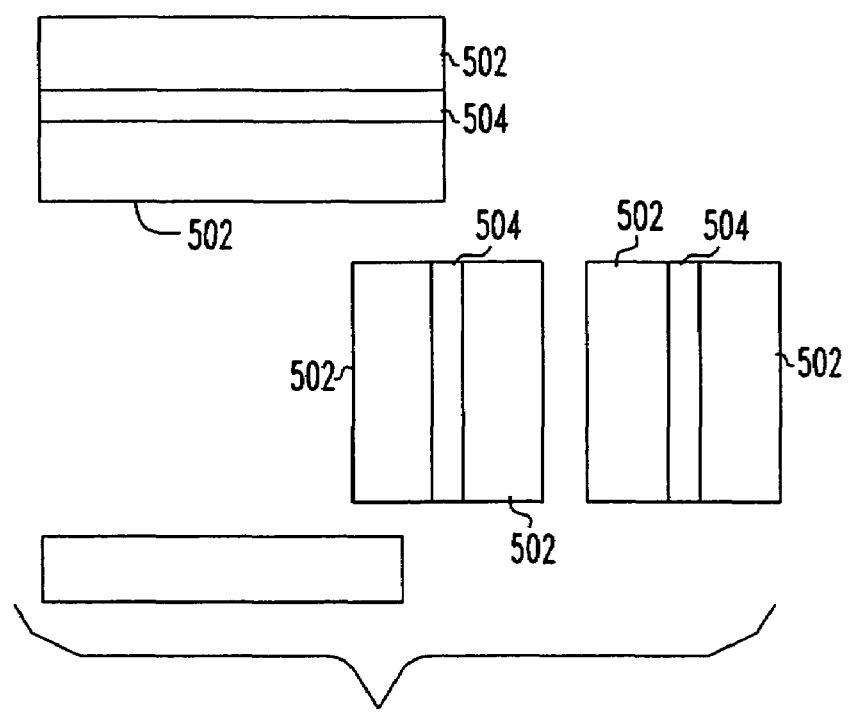
FIG. 5B *(PRIOR ART)*

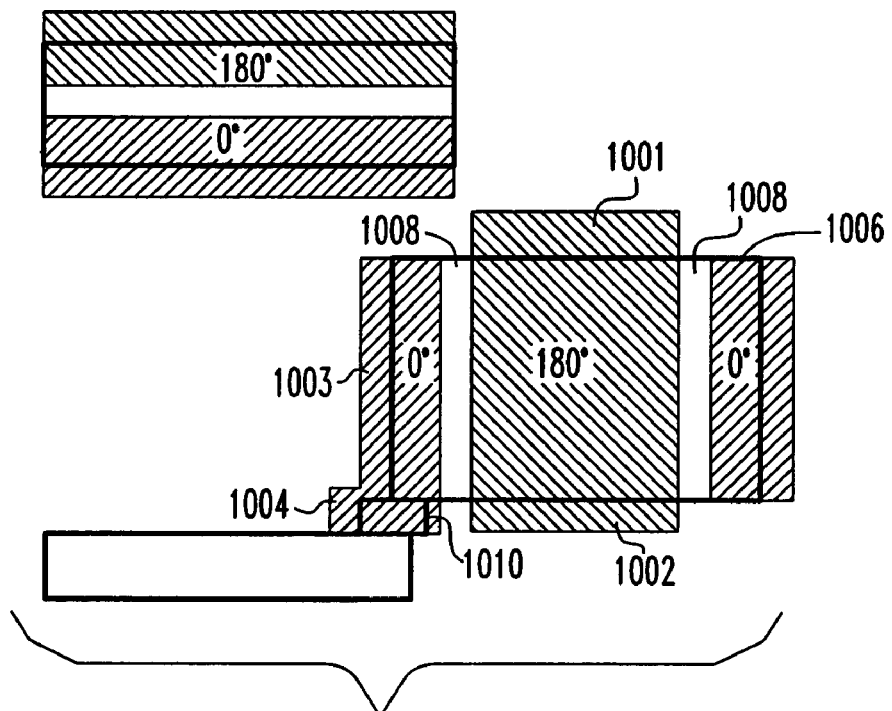
FIG. 10 *(PRIOR ART)*
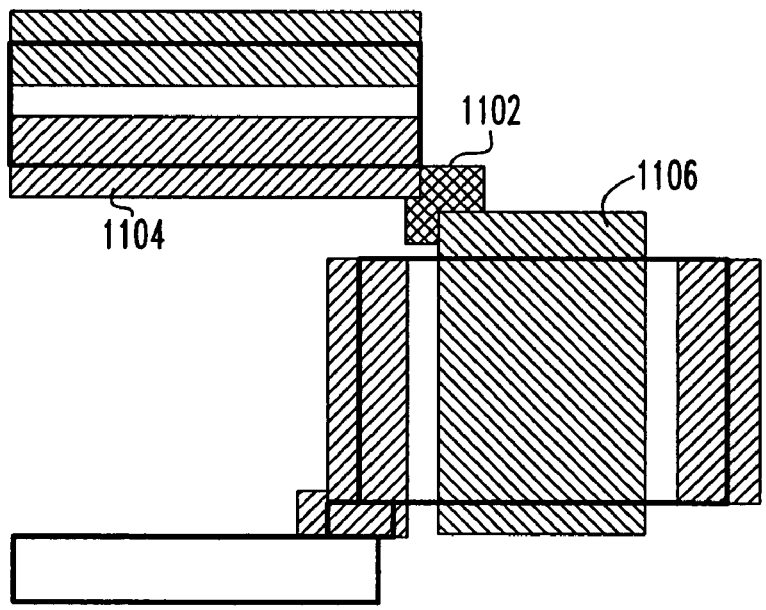
FIG. 11 *(PRIOR ART)*

GENERATING MASK PATTERNS FOR ALTERNATING PHASE-SHIFT MASK LITHOGRAPHY

BACKGROUND OF INVENTION

This invention relates to photolithographic methods employed in the manufacture of very large-scale integrated (VLSI) circuits and more specifically to improved methods for generating patterns of photomasks.

Optical lithography has long been a key enabler to the rapid pace of integration that fuels the microelectronics industry. However, the resolution demands of the integrated circuit (IC) industry have outpaced the introduction of more advanced lithography hardware solutions for many technology generations, making lithographic patterning increasingly difficult and requiring the use of increasingly complex resolution enhancement techniques (RET) to maintain adequate pattern fidelity.

To put the discussion on RET and their impact on layout into proper context, it will be helpful to first review some simplified concepts of optical lithography, and then review the exposure tool options for the next two major sub-90 nm technology nodes, and then discuss the basic principles of RET.

For the purpose of this discussion, an optical lithography system can be represented as drawn in FIG. 1A. A coherent plane of light 2, characterized by its wavelength, $\lambda$, illuminates a photomask 3, which can be seen as an opaque stencil of the desired pattern. The light passing through the openings in the photomask 3 is focused by lens optics 4 onto an image plane of a wafer 5. At the dimensions in which modern IC lithography operates, the openings in the photomask 3 can be approximated as individual light sources 6, 7 described by their centerline spacing or pitch, P. Since light penetrating neighboring mask openings is coherently related, constructive interference will cause diffraction nodes at any angle for which the geometric pathlength difference between the beams of light is equal to an integer multiple of the wavelength of light, or $$\sin \theta = m\lambda/P \tag{1}$$

The maximum diffracted angle that a projection lens can capture and use for image formation is defined as the maximum numerical aperture (NA) of the lens. Since one has to capture at least one diffracted order (the $0^{th}$ order contains no spatial information), equation 1 can be rewritten as, $$P_{min} = \lambda/NA \tag{2}$$

Or, in the more popular approximation assuming the minimum feature size, R, is simply P/2, $$R_{min} = 0.5\lambda/NA \tag{3}$$

How close any given lithography process comes to this theoretical resolution limit is commonly expressed by the Rayleigh factor $k_1$, $$R = k_1 \lambda/NA \tag{4}$$

Equation 4 provides a coherent approximation to conventional optical lithography. As is apparent from equation 4, the resolution is proportional to $\lambda$, and inversely proportional to NA. These two physical quantities are constraints on the minimum feature size R that can be printed, also referred to as the "half pitch" (P/2) according to the above relation.

In addition to defining the fundamental resolution limit of a patterning system, the Rayleigh factor is also used as a unitless measure of lithographic challenge, i.e., the quantity $k_1$ which is defined as $$k_1 = \text{Dimension } (NA/\lambda) \tag{5}$$

expresses how difficult it is to resolve a certain dimension with a given lithography tool and is often used in lieu of the feature size R.

The role of depth of focus and the equations governing it will now be discussed. As illustrated in FIG. 1A, the image on the wafer, at the resolution limit, is formed by the interference of the $0^{th}$ and $1^{st}$ diffracted orders. Since the $0^{th}$ diffracted order traverses the optical system perpendicular, i.e. along the center axis of the optical system, a pathlength difference $\Delta PL$ is introduced relative to the higher diffracted orders. This pathlength difference changes as a function of the vertical image plane displacement z according to the relation:

$$\Delta PL = z - z \cos \theta \tag{6}$$

The change in pathlength difference causes the phase relationship between the beams to vary. Rayleigh defines the depth of focus (DOF) as the vertical displacement for which the pathlength difference between the two beams is $\lambda/4$, leading to the relation:

$$DOF = (\lambda/4)(1/(1-\cos \theta)) \tag{7}$$

After some trigonometric contortions and substitution of NA for $\sin \theta$, equation 7 reduces to the commonly quoted DOF equation, $$DOF = \lambda/(2NA^2) \tag{8}$$

highlighting the inverse square dependence of DOF and NA. This rapid loss of DOF in relation to NA is one of the fundamental limitations of high-NA lithography.

The role played by the wavelength of the illumination source will now be discussed. The direct correlation of lithographic resolution and illumination wavelength, as stated in equation 4, has traditionally been the main resolution reduction enabler.

TABLE 1

| Source | $\lambda$ (nm) | $\lambda$ ratio | Intended Resolution | Year of Introd. |
|---|---|---|---|---|
| G-line | 436 | | micron | |
| I-line | 365 | .83 | half-micron | 1984 |
| KrF | 248 | .68 | quarter-micron | 1989 |
| ArF | 193 | .78 | 100 nm-node | 2001 |
| $F_2$ | 157 | .81 | 65 nm-node | Expect 2004 |
| $Ar_2$ | 126 | .80 | 45 nm-node | * |

Lithography wavelengths and their applicability,
*126 nm lithography is no longer considered a viable option.

Table 1 lists past, present, and future lithography wavelengths, their resolution in terms of applicable product, and their year of introduction. This short list makes a few important points: there are only a few distinct wavelengths that can be used for lithography; that an end of the available light sources is coming quickly; and the ratio of wavelength reduction in most cases is not even enough to support one linear shrink of 70%.

Not captured in Table 1 is the immense financial and time investment in introducing not only an exposure tool at a new wavelength but a full patterning solution including resist and etch processes. As the drive to develop new exposure tools at shorter wavelengths continues, severe physical barriers to implementation arise in: insufficient light intensity requiring super-sensitive chemically amplified resist systems, increased light absorption forcing more exotic optical materials and tighter cleanliness specifications on all optical components including the photomask, and ultimately, the need to operate in vacuum with reflective optics.

The determination of numerical aperture (NA) and its importance in optical lithography are now discussed. Being defined as the sine of an angle, the mathematical limit of the numerical aperture (NA) is 1. Controlling critical parameters such as aberrations and focal plane flatness over large areas during lens manufacturing has made the introduction of NAs larger than 0.7 very difficult. Finally, the inverse quadratic relationship between DOF and NA (equation 8) make it challenging to manufacture with NAs much above 0.7 (for a NA of 0.7 the DOF is roughly $2\lambda$, requiring extreme control of wafer flatness, reduction of process induced topography, and very tight focus control in the exposure). Nonetheless, state of the art exposure tools use NAs of 0.75 in wafer production and 0.85 NA tools are soon to be introduced.

Trends in the adoption of new lithography solutions in manufacturing will now be discussed. Table 2 shows how lithography solutions have evolved as smaller features sizes are demanded. As expected, wavelength has been decreasing and NA has been increasing. However, $k_1$ has been continuously declining in spite of tooling improvements; i.e., lithography has been losing ground due to ever harder technology generations. Finally, for each technology generation two distinct lithography solutions can be identified; a very aggressive, low $k_1$ development phase followed by a somewhat relaxed manufacturing phase.

TABLE 2

| ITRS Node | Man. Year | Min. Pitch | Dev. λ/NA | Man. λ/NA | Dev. $k_1$ | Man. $k_1$ |
|---|---|---|---|---|---|---|
| 180 | 1999 | 500 | 248/.50 | 248/.75 | .50 | .76 |
| 130 | 2001 | 300 | 248/.75 | 193/.75 | .45 | .58 |
| 90 | 2003 | 214 | 193/.75 | 193/.85 | .42 | .48 |
| 65 | 2005 | 160 | 193/.85 | 157/.85* | .35 | (.43) |
| 45 | 2007 | 130 | 157/.85* | Unknown | (.35) | Unknown |

λ/NA solutions for recent technology nodes [1], illustrating the constant erosion of $k_1$ for both technology development (Dev.) and manufacturing (Man.)
*Potential Solution Table 2 clearly highlights the need for a lithography solution that can deliver $k_1$ factors smaller than 0.5.

Two-beam imaging techniques will now be discussed, as an example of strong-RET. If, as illustrated in FIG. 1B, one were able to "push back" one of light sources approximating the mask openings, 6,7 by ½ λ, to obtain mask openings 161, 171 one would obtain a very different diffraction pattern, which is more spatially confined in the horizontal imaging plane.

Since the first interference now occurs at an angle that adds ½ λ pathlength difference (rather than 1 λ for conventional lithography) the minimum set of diffracted orders required to form an image for a given pitch are much closer to the center of the imaging lens. For a given NA, the ultimate resolution, in terms of half-pitch, is now described by $$R = 0.25\lambda/NA \tag{9}$$

From an examination of equations 4 and 9, the Rayleigh factor $k_1$ here is 0.25. In addition, no constructive interference occurs at the 0 degree angle (the light sources are ½ λ out of phase), so the perpendicular beam is eliminated and with it the DOF limitations of equation 8. Therefore, two-beam imaging provides 50% resolution improvement and significantly enhanced DOF.

One popular means of achieving two-beam imaging is shown in FIG. 1C. To obtain the ½ λ phase offset, alternating phase shifted mask lithography (altPSM) manipulates the topography of the mask 14 to vary the respective etch depth of juxtaposed openings 18, 19 in the light transmitting medium 13 of the mask 14 by an $$\text{Etch Depth} = 0.5\lambda/(n-1) \tag{10}$$

where n is the refractive index of the mask substrate, typically around 1.4.

By varying the etch depth of juxtaposed mask openings in this manner, the light traversing the two openings will exhibit a phase difference of 180 degree. Taking this approach a step further, a technique known as phase coloring is performed. In the phase coloring process, a plurality of "intrusion pairs" of juxtaposed mask openings which exhibit a 180 degree phase difference are formed on opposite sides of a critical dimensioned feature of the chip layout. The intrusion pair includes a zero degree phase region on one side, and a 180 degree phase region on the opposite side of the critical dimensioned feature.

An example of use of the above-described techniques is illustrated in FIGS. 2A through 3D. FIG. 2A is a plan view of a layout 10 of a feature to be printed, which cannot be printed with sufficient accuracy when employing only non-phase shifted mask techniques. The transistor layout 10 has a wide rectangular head T1, shoulders 10S, and a narrower vertical leg V1. The vertical leg V1 is formed as a narrow linewidth feature having a sub-cutoff dimension, i.e., a dimension smaller than the minimum feature size of traditional photolithography for the system in use. The head T1 is wider than the cutoff dimension. To achieve the desired exposure pattern in the resist, images are projected onto the resist layer of a substrate using two different masks in sequence. The first mask is a dark field alternating phase shift mask 15. The first mask includes intrusion pairs of zero degree and 180 degree phase-shifting regions 12', 14' respectively, and is used for making critical dimensioned exposure patterns on the wafer. The first mask 15 is opaque in all areas 13 except where the intrusion pairs 12', 14' are located. The second mask 16 is a bright field trim mask, which is transparent in all areas 17 except where block mask patterns 18 are present. The second mask 16 is used to expose the resist a second time after the resist is exposed using the first mask 15. This technique is used with a positive resist in which exposed areas are developed away, leaving the unexposed areas to remain as the desired pattern.

FIG. 2B illustrates a dark field altPSM mask 15 and FIG. 2D illustrates a block pattern of a bright field trim mask 16 corresponding thereto. FIGS. 2C and 2E illustrate corresponding patterns in the resist after lithographic exposure with the masks 2B and 2D, respectively. As illustrated in FIGS. 2C and 2E, the lithographic exposures have resulted in resist patterns 12", 14", and 17' that have rounded corners instead of the original block shapes, due to the resolution limits described above. FIG. 2F shows the combined lithographic exposure pattern 10' that results after exposure with the dark field altPSM mask 15 and another exposure with the bright field trim mask 16. As illustrated in FIG. 2F, the resulting exposure 10' reasonably approximates the desired pattern 10 of FIG. 2A.

FIGS. 3A through 3D illustrate a sequence of steps performed in a prior art method of generating patterns of an altPSM mask and a block (trim) mask corresponding thereto. This process takes advantage of the constructive interference of light to double the achievable resolution of the optical lithography system. The light interference is created by selectively manipulating the topography of the photomask to introduce an appropriate path-length difference in the imaging light.

FIG. 3A illustrates a transistor polysilicon shape 20 to be patterned by a dual exposure altPSM method. Each of the sample polysilicon shapes 20 reflects a shape similar to that of the desired transistor shape 10 shown in FIG. 2A, having a sub-cutoff dimension to be patterned by an altPSM mask having a pair of inverse phase-shifting regions 22, 24 of zero degrees and 180 degrees phase shift on opposite sides of the transistor shape to be patterned. In addition to having inverse phases assigned on opposite sides of the critical dimensioned feature, the phase shapes or regions need to obey a variety of lithographic, mask manufacturability, and design rules governing their size and spacings. Note that the design of an altPSM layout, as shown, requires that the inverse phase shifting shapes be located on opposing sides of the sub-cutoff dimension feature, such that one of the two inverse phase shapes is assigned a phase shift that is 180 degrees out of phase from that of the phase shape on the opposite side of the sub-cutoff dimension feature.

The key to this specific example is the fact that two phase shift patterns need to be defined for each critical segment of a layout structure. As shown in FIG. 2A, both the zero degree phase shapes 22 and the 180 degree phase shapes 24 have to be defined as patterns in a data set representing the mask, even though no special processing is required to define zero degree phase shapes 22 in the mask.

Referring to FIG. 3B, this figure is an illustration of a dark field alternating PSM layout. The sample polysilicon layout is still shown at 20 and the block mask 26 is illustrated by the crosshatched areas.

When the resist is then exposed, once with the altPSM mask of FIG. 3A and once with the block trim mask of FIG. 3B, the final exposure pattern will be formed in the photoresist as the difference between the shadow cast by the block pattern 26 and the interference pattern produced by the zero degree and 180 degree phase shapes 22, 24 respectively.

One approach to improve lithographic performance has been to optimize altPSM parameters. An example of this is illustrated in FIGS. 3C and 3D. In FIG. 3C an optimized altPSM layout is shown having phase extensions 30 (bottom of 180 degree portion) and phase end hammerheads 32 (top of 180 degree portion). This specific example is optimized to the situation where a gap between two primary features is filled with a common block shape being entirely covered by the block edge, and the phase edge is extended past its regular position. To further optimize the layout and preserve layout density, the top edge is not linearly extended, but hammerheads are added to counteract phase end shortening. FIG. 3D is a block mask similar to FIG. 3B.

The fundamental lithographic principles of the double exposure processes illustrated in FIGS. 2A through 2F and 3A through 3D dictate a simple layout rule for the phase and block shapes. This rule provides that the desired layout pattern to be provided on the wafer should be constructed as the Boolean difference between the block shapes and the phase shapes of the pair of altPSM mask and trim mask. Another way of expressing this rule is that wherever there is a block shape, there also needs to be a phase shape. Violation of this rule results in a residual resist image on the wafer, or, in other words, unexposed resist that can cause defects on the wafer.

The constraints of manufacturability and the fundamental lithographic resolution for both phase shifting patterns and block patterns of a mask require that such patterns be constrained to certain minimum width and spacing. While block masks and phase masks must each conform to their own set of unique manufacturability and lithography constraints, problems arise when the block mask is legalized independently from the phase-shifting mask, or vice versa. This is because the different processes required to manufacture a block mask, as compared to a phase-shifting mask, and the different parameters with each type of mask is used to expose a resist layer of a substrate, require that different minimum widths and minimum spaces be designated for each type of mask.

FIG. 4 illustrates process steps in the generation of phase shapes of an altPSM mask and block shapes of a corresponding block (trim) mask for use in a dual exposure method. In a first step 101 of the prior art method of FIG. 4, design data for a circuit layout (e.g. from a circuit design program) is input to a processor. Next, in step 102, all critical segments of the layout are identified. Then, the method progresses to the next step 103 of creating basic phase shapes, i.e. the rough outlines of the polygons which will receive the phase information are defined.

In the next step 104, layout violations are removed from the generated phase shapes by a legalization process. Legalizing is the process of checking and adjusting or fixing patterns so that they conform to minimum space rules between features and minimum width rules, which are imposed by the lithography and mask manufacturing process. After this step, the phase regions are then colored (step 105).

Thereafter, the shapes of the block mask are generated (step 106), and the block mask including those shapes is then legalized, in step 111. A check is then made, in decision block 112, to determine if the shapes of the phase-shifting mask are correctly adjusted for the shapes of the block mask that has just been generated. Very often, they are not, in which case, the result of the decision block 112 is "No", and the process resumes again at step 104 with legalizing the shapes of the phase-shifting mask. In time, new block shapes may be added when step 111 is encountered again to legalize the shapes of the block mask. Accordingly, the prior art method shown in FIG. 4 is a circular method in which the shapes of the block mask depend on the shapes of the phase-shifting mask, but the shapes of the phase-shifting mask also depend on the shapes of the block mask.

A problem with the prior art method of FIG. 4 is the need to continually modify the layout by going back to the redefinition of critical segments. While the optimization altPSM parameters as provided above show great promise in improving lithographic performance, the circular definition of mask features challenges the capabilities of current tools to generate suitable altPSM and block mask combinations. As illustrated in FIG. 4, the details of the phase shape design depend on critical layout segments, and the details of the block mask design depend on both critical layout segments and the exact phase design, but the exact phase design also depends on details of the block mask design.

Therefore, a new approach is needed that can address the need for a better and more cost and time efficient method of generating mask patterns. The present invention addresses these concerns by improving the parameter definition and design flow of generating altPSM mask and block mask pairs to generate lithographically optimized and logically correct altPSM layouts.

FIGS. 5A through 11 illustrate steps in a prior art method for generating block patterns and phase-shifting patterns of a block (trim) mask and an altPSM mask for use in a dual exposure method for defining critical dimensioned features in a resist pattern of a substrate.

As shown in FIG. 5A, a feature 401 and critical dimensioned features 402 of a circuit layout are identified according to step 102 of the method shown in FIG. 4. Then, as shown in FIG. 5B, a set of phase regions 502 are then generated for the phase shifting mask, the phase regions 502 lying on each side of the critical dimensioned features 504 to be patterned. Thereafter, the phase regions are legalized, resulting in one larger phase region 602, as shown in FIG. 6, because the prior spacing between the phase regions 502 did not conform to rules for minimum spacing between adjacent phase regions.

Then, a step of coloring the legalized phase regions is conducted, as shown in FIG. 7, in that the shapes 702 are assigned zero degree phase and shapes 704 are assigned 180 degree phase. Next, as shown in FIG. 8, the shapes of the block mask are designed. Since, as illustrated in FIG. 2, the function of the block mask patterns in this double exposure altPSM technique is twofold: 1) to cover and protect shapes patterned by the phase mask; and 2) to image non-critical shapes that are not being patterned by the phase mask, the block mask consists of two types of patterns, one where the block mask is coincident with non-critical patterns, 806, the other where the block pattern 802, 804 extends beyond the side-edges of critical shapes 801 but stops short of the edges of the phase shapes, 702, 704.

Next, as shown in FIG. 9, the block mask shapes are now legalized, such that the pattern of block shapes are checked for conformity with rules regarding minimum block shape width and minimum spacing between block shapes. When neighboring block shapes are spaced more closely than the minimum width, the mask rule requires that the subminimum width space between them be filled with another block shape. This result is illustrated in FIG. 9 by the addition of the block shape 901 between the block shapes 902 and 903.

At this time, it is appropriate to comment on the accuracy of the resulting patterns generated by the prior art method of FIG. 4. Thus far, the shapes of the phase mask have been generated and legalized, and the shapes of the block mask have been generated and legalized thereafter. However, there is yet much to do before the shapes of both masks are finalized. The shapes of the altPSM mask must now be legalized again for conformity with the rules on minimum width and minimum spacing between respective phase shapes. In addition, once that legalization is performed, the block shapes must also be adjusted and legalized again.

One possible way of reducing the cycle of legalizing the phase shapes relative to the block shapes, and then legalizing the block shapes again relative to the changed phase shapes, would be to generate the phase shapes in the first instance based on predictions of the block mask shapes to be generated thereafter. However, the actual layouts of different chips present many complicated topologies in which predicting the geometry of the block mask shapes is difficult to do accurately based on the phase patterns to be generated.

Next, as shown in FIG. 10, the shapes of the phase mask are now adjusted relative to the block mask shapes that have been created, such that certain of the phase shapes are now enlarged in this step. Thus, the shapes 1001 and 1002 which extend outside the block shape 1006 are now added to counteract phase-end shortening when the masks are used to print the critical dimensioned features 1008, and a phase shape 1004 at zero degree phase is added which adjoins the existing zero degree phase shape 1003 in the location of the added block mask shape 1010.

However, after this step has been performed, it is apparent that sufficient changes may have been made to the shapes of the phase mask that the changed shape pattern may need to be legalized again for conformity with the minimum width and minimum spacing rules. Hence, control is now returned again to step 104 of the method illustrated in FIG. 4. As shown in FIG. 11, this step now results in a new shape 1102 being added between the shapes 1104 and 1106 of the phase mask, where minimum spacing did not exist before between those shapes 1104 and 1106.

The shortcomings of the prior art having been described, it would be desirable to provide a more efficient, more reliable method of generating patterns of a phase mask and of a block mask for use in performing dual exposure altPSM lithography to define critical dimensioned features in a resist on a substrate.

SUMMARY OF INVENTION

Accordingly, the present invention provides a method and apparatus of generating mask patterns for an alternating phase shift mask, in which block-mask patterns are generated first, based on critical segments of the primary layout, not based on the phase mask pattern design. Thereafter, the phase mask patterns are derived from the block mask patterns as well as the critical segments of the primary circuit layout.

A method of generating patterns of a paired set of photomasks from a data set defining a circuit layout to be provided on a substrate includes identifying critical segments of the circuit layout to be provided on the substrate. Block mask patterns are generated and then legalized based on the identified critical segments. Thereafter, phase mask patterns are generated, legalized and colored. The legalized block mask patterns and the legalized and colored phase mask patterns define features of a block mask and an alternating phase shift mask, respectively, for use in a dual exposure method for patterning features in a resist layer of a substrate.

BRIEF DESCRIPTION OF DRAWINGS

FIGS. 5A–11 illustrate sequences of generating shapes of a phase-shifting mask and shapes of a block mask according to the method illustrated in FIG. 4.

DETAILED DESCRIPTION

Figure 12:
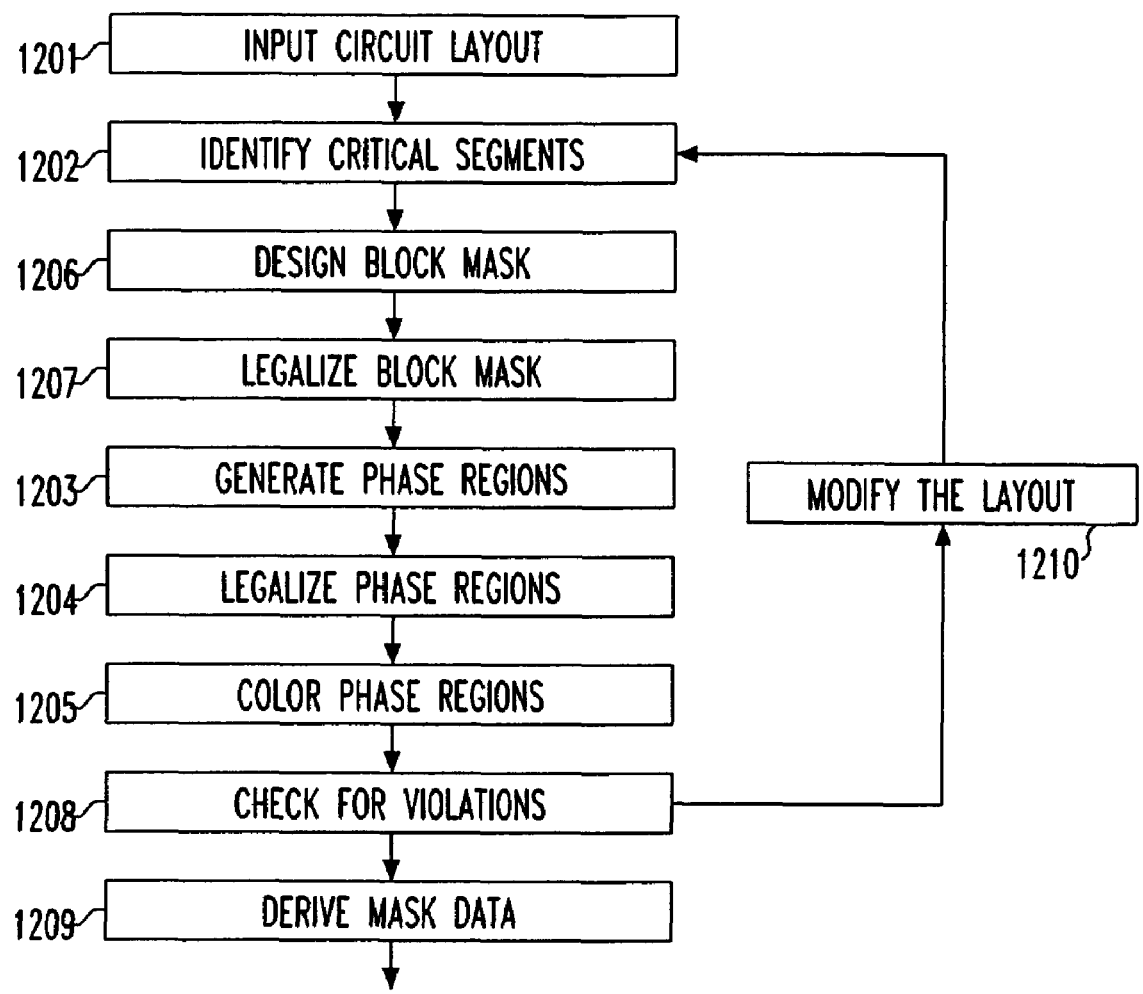
FIG. 12 is a flowchart illustrating steps performed in an embodiment of the invention to generate phase-shifting shapes and block shapes for inclusion in an altPSM mask and a block (trim) mask used therewith in a dual exposure altPSM lithography method.

FIG. 12 is a flowchart illustrating an embodiment of the present invention. As indicated above, it is desirable to improve the process and flow for generating the patterns of a pair of an alternating phase-shifting mask (altPSM) and block (trim) mask used together in a dual exposure lithography method. It is desirable to generate pairs of altPSM and trim masks from input circuit layout data in a way that lithographically optimized and logically correct exposure patterns can be produced on a wafer. In furtherance of these goals, and towards reducing the time and processor resources required to generate patterns for such mask pairs, in an embodiment of the invention, an approach is provided for defining all parameters of the block (trim) mask only as a function of the primary circuit layout. Thereafter, parameters of the phase shape patterns are defined as a function of both the primary circuit layout, as well as the block mask patterns.

Figure 1A:
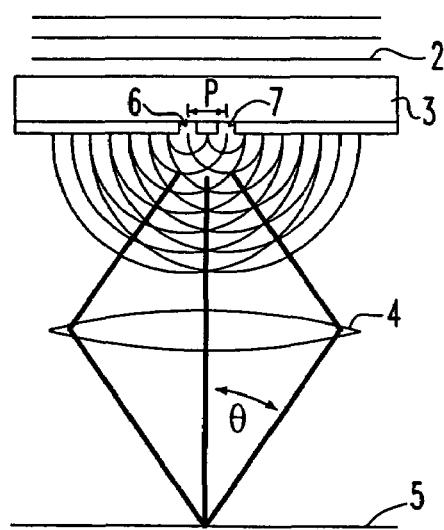
FIG. 1A illustrates principles of optical lithography.
Figure 1B:
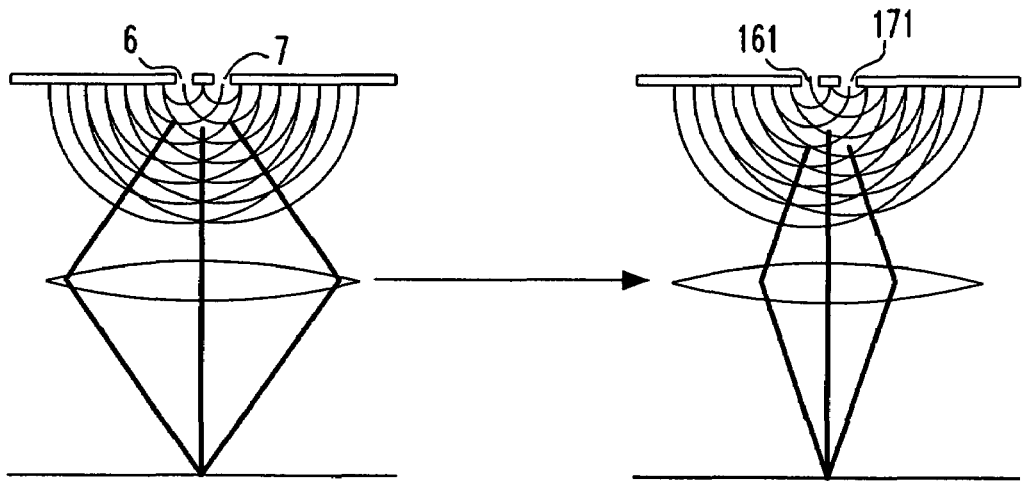
FIGS. 1B and 1C illustrate two-beam imaging principles in alternating phase-shift mask lithography.
Figure 1C:
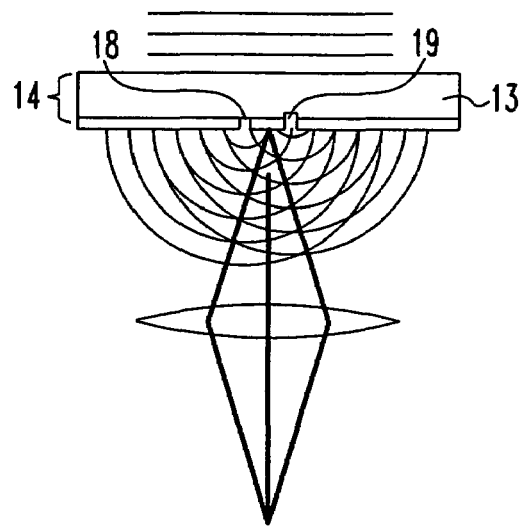
Figure 2A:
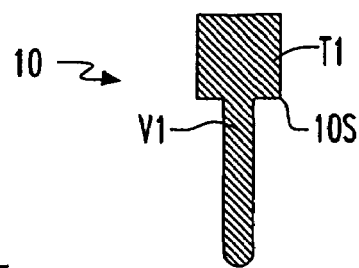
FIGS. 2A through 2F illustrate steps in the performance of a dual exposure altPSM method using a dark field phase-shift mask and a bright field block (trim) mask.
Figure 2B:
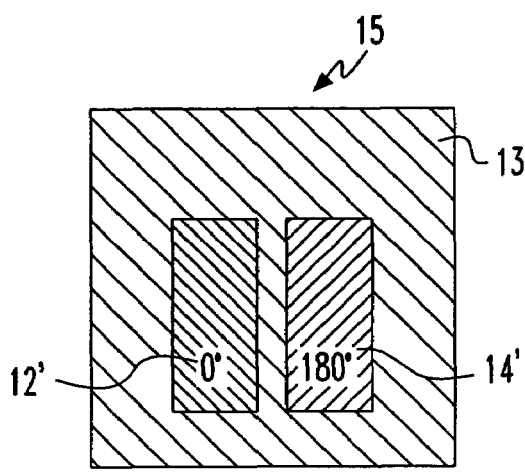
Figure 2D:
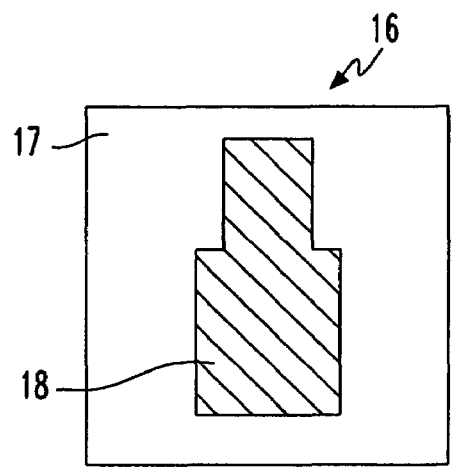
Figure 2C:
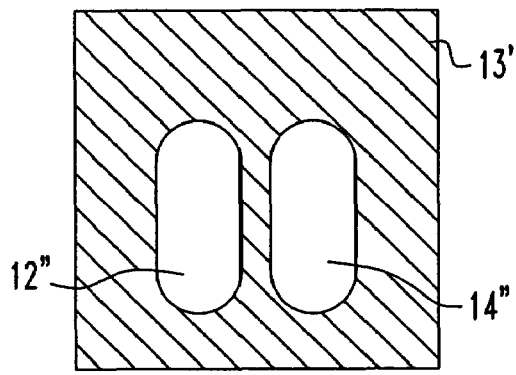
Figure 2E:
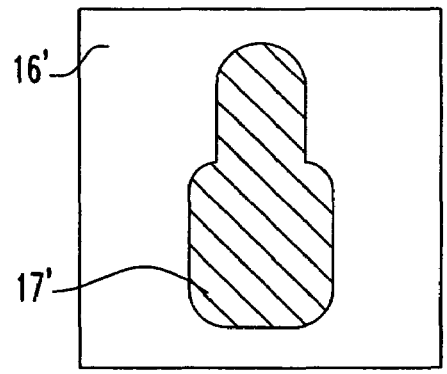
Figure 2F:
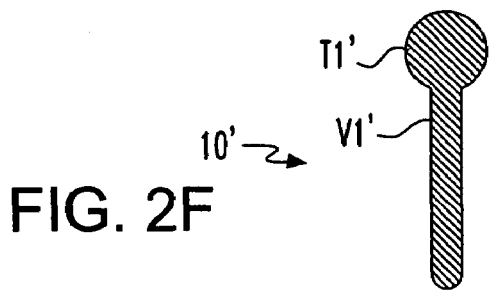
Figure 3A:
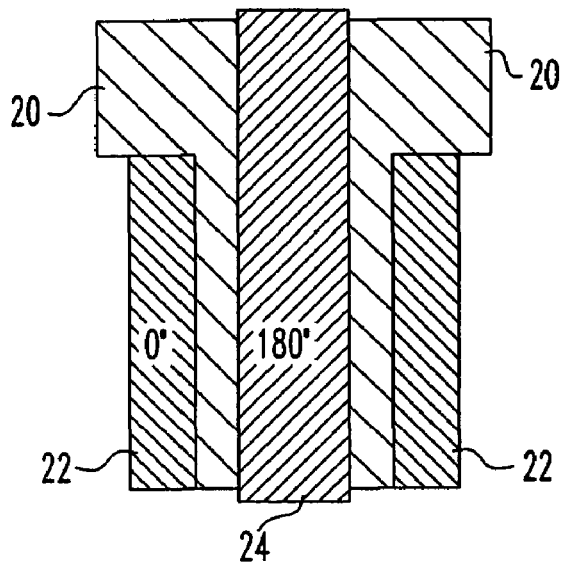
FIGS. 3A through 3D illustrate sequences in a prior art method of generating phase-shifting shapes and block shapes for inclusion in an altPSM mask and a block (trim) mask used therewith in a dual exposure altPSM lithography method.
Figure 3B:
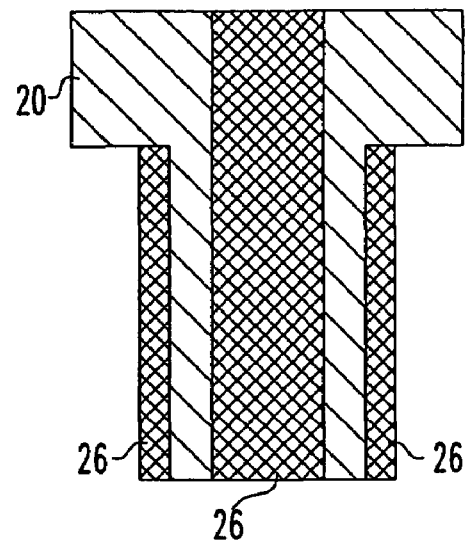
Figure 3C:
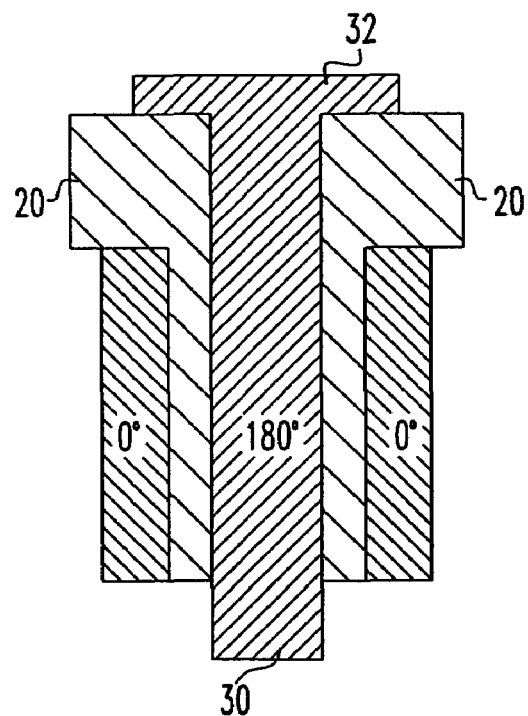
Figure 3D:
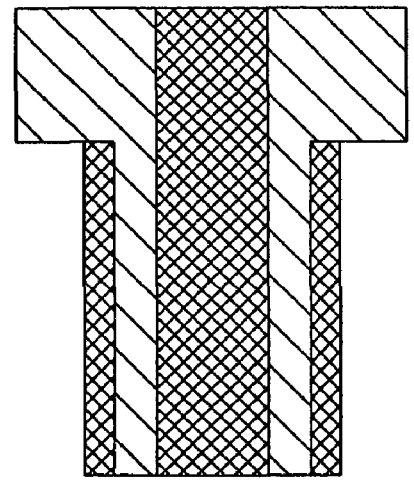
Figure 4:
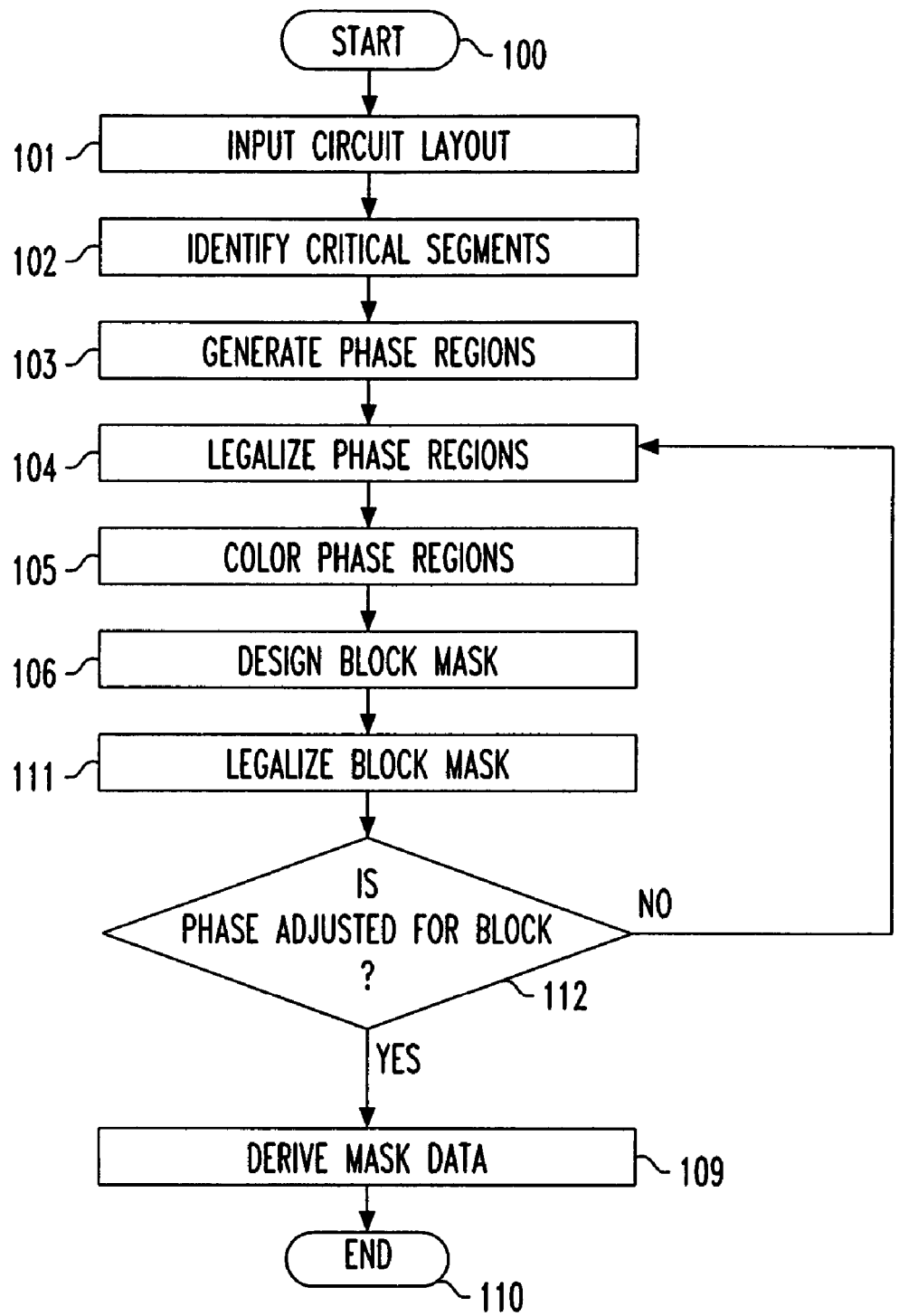
FIG. 4 is a flowchart illustrating steps performed in a prior art method to generate phase-shifting shapes and block shapes for inclusion in an altPSM mask and a block (trim) mask used therewith in a dual exposure altPSM lithography method.
Figure 6:
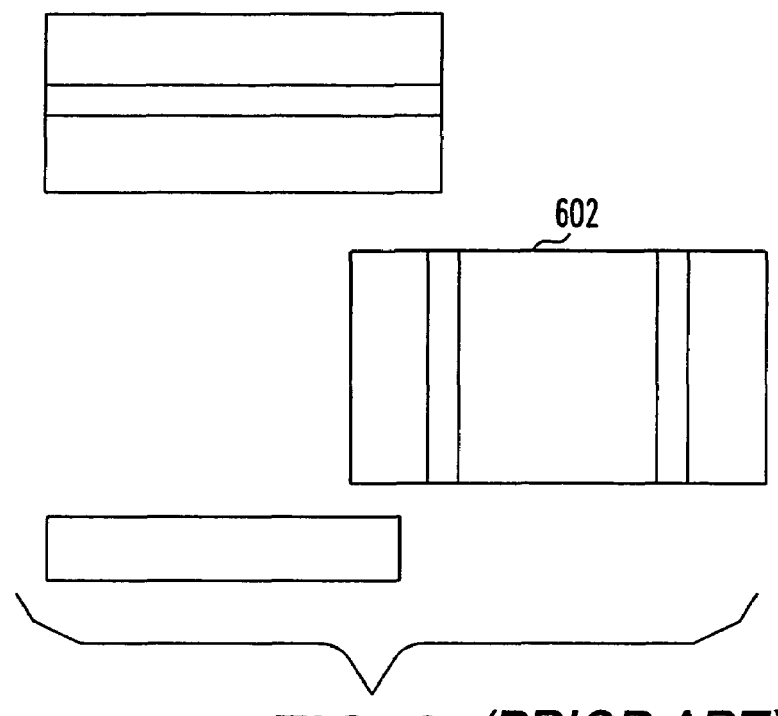
Figure 7:
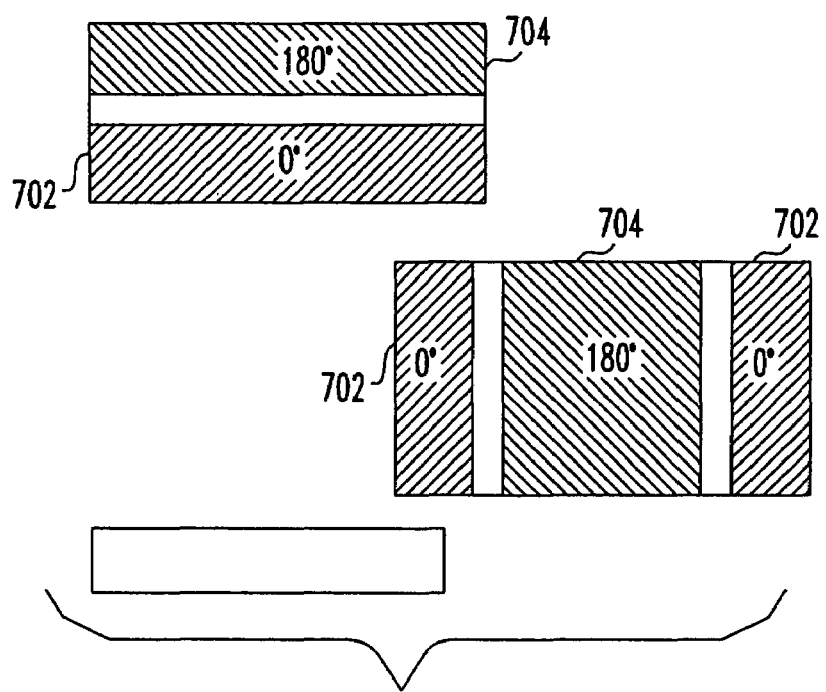
Figure 8:
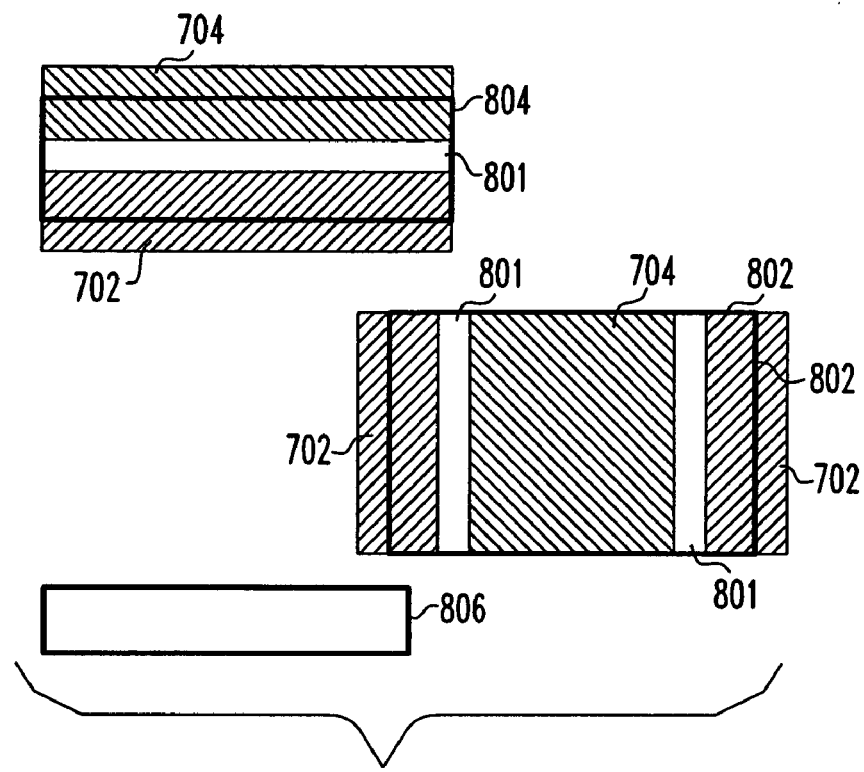
Figure 9:
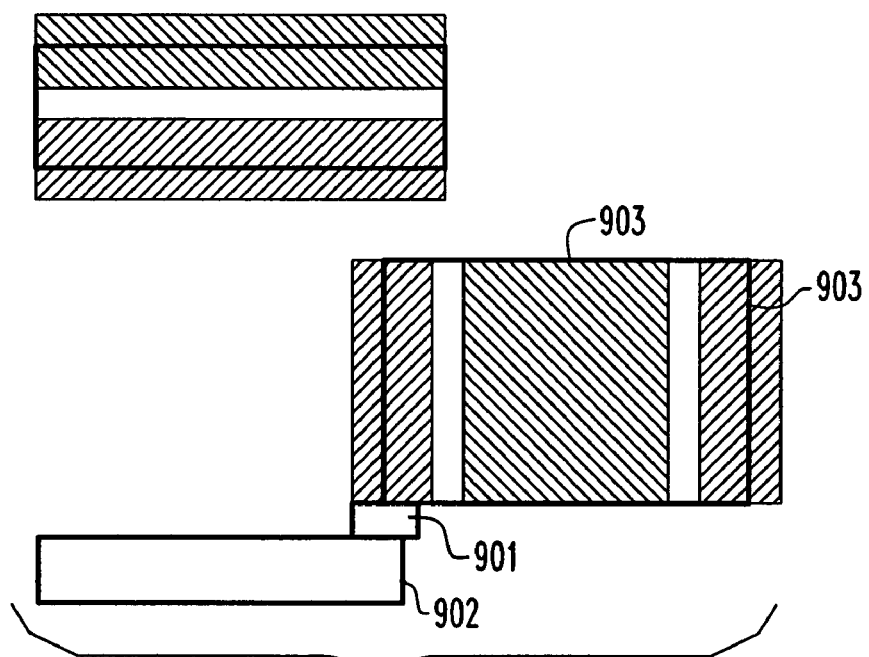

In the embodiment shown in FIG. 12, steps for generating phase-shift mask patterns and block mask patterns are performed in the reverse order from those performed according to the prior art method shown in FIG. 4. To understand the particular differences between the embodiment of the invention and the prior art method, the steps of the method of the embodiment shown in FIGS. 12–18 will be compared to the steps of the prior art method, as described above relative to FIGS. 4 through 11.

Figure 13:
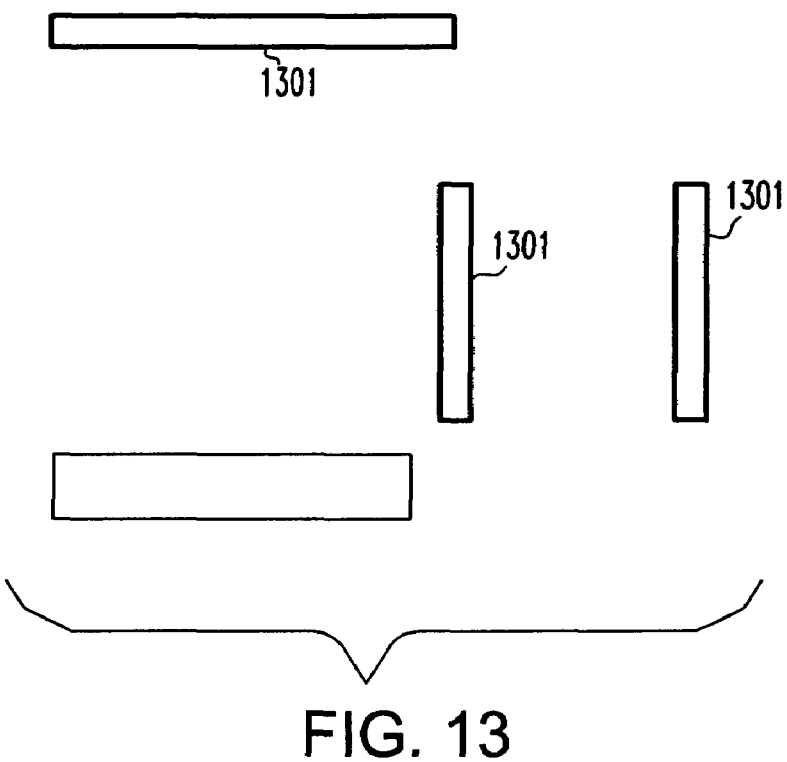
FIGS. 13–18 illustrate sequences of generating shapes of a phase-shifting mask and shapes of a block mask, according to the method illustrated in FIG. 12.

As in the prior art method, in the embodiment of the invention, the mask generation process begins with the inputting (1201) of a circuit layout and identification (1202) of the critical segments of the circuit layout. Critical segments are those segments of the layout which have critical dimensions, e.g. at or below the cutoff dimension of the lithography system being used. Critical segments are shown in FIG. 13 as the segments 1301 having narrow width that is below the cutoff dimension, i.e., smaller than can be photolithographically defined using only a block mask pattern.

Figure 14:
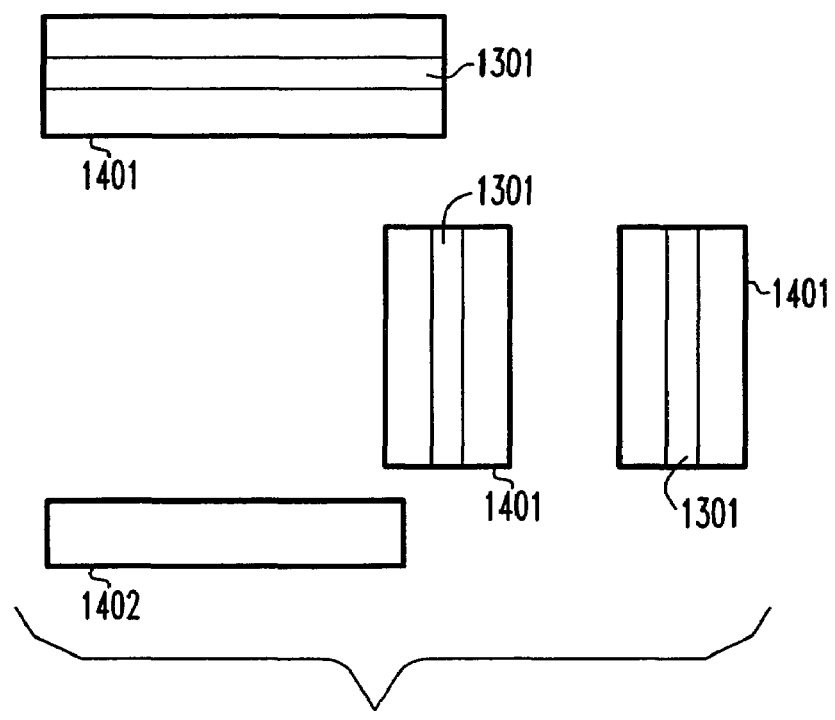

This step is then followed by the step (1206) of designing the block mask, i.e., designing the mask shapes 1401 and 1402 of the block mask, as shown in FIG. 14. These appear as the larger shapes 1401 corresponding to and surrounding each of the identified critical segments 1301, shown for reference, as well as the shape 1402 which surrounds the non-critical segment. This step (1206) differs from the prior art method in that it is performed prior to generation of the phase regions of the altPSM mask, and it is performed based only on the critical segments of the circuit layout that have been identified. The prior art method, by contrast, performed the step of generating block mask patterns after generating the phase regions, and did so based on both the critical segments of the layout and the shapes of the already generated phase mask design.

Figure 15:
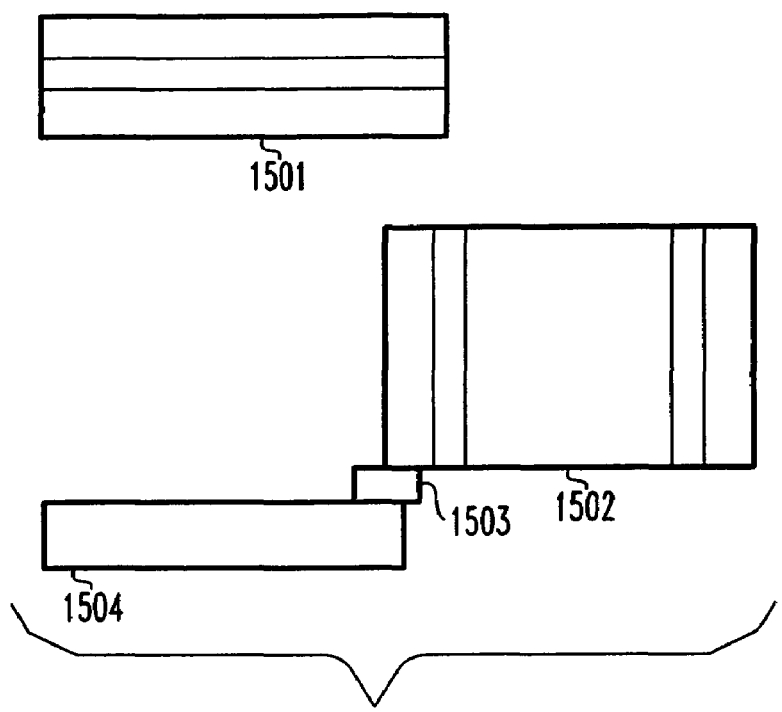

The next step in the method is to legalize (1207) the block mask patterns, as shown in FIG. 15. In this step, the block mask shapes are checked for conformity with rules that require that each block mask shape to have a minimum width and that a minimum space be provided between neighboring block shapes. As a result of the legalization step, block mask shapes 1501 and 1504 remain unchanged as they already conform to these rules. However, block mask shape 1502 is enlarged, because, before that time, the spacing between block mask shapes was less than the minimum width. In addition, a new block mask shape 1503 is generated to fill the subminimum dimension that is not permitted to exist between the shapes 1502 and 1504.

Figure 16:
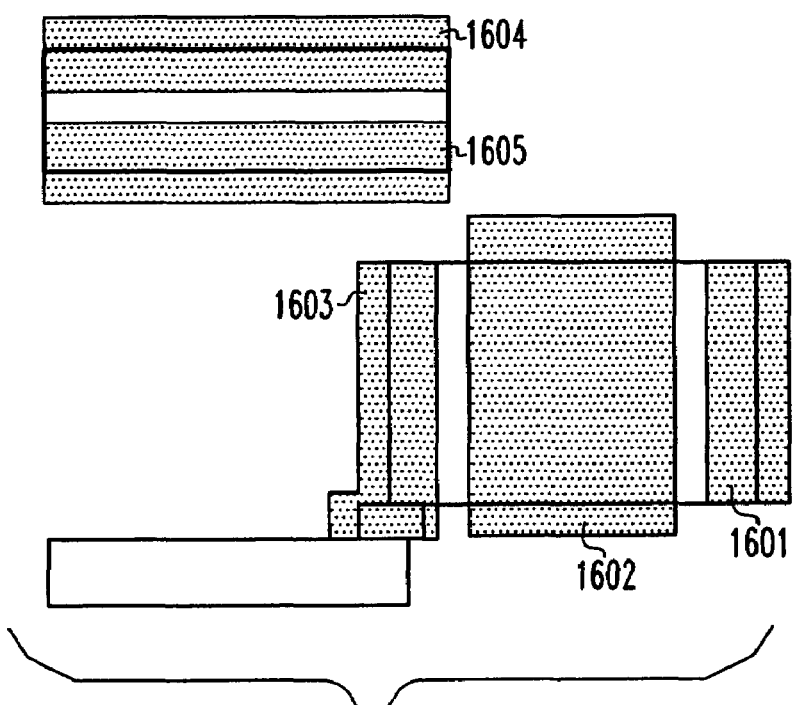

Thereafter, as shown in FIG. 16, phase regions 1601–1605 of the altPSM mask are generated (step 1203). The phase regions define the locations where mask shapes having alternating phases are to be located. However, in the embodiment of the invention described here, the actual amount of phase shift and the locations of phase-shifting elements are not determined until a coloring step that occurs after the dimensions of the phase regions are determined.

Figure 17:
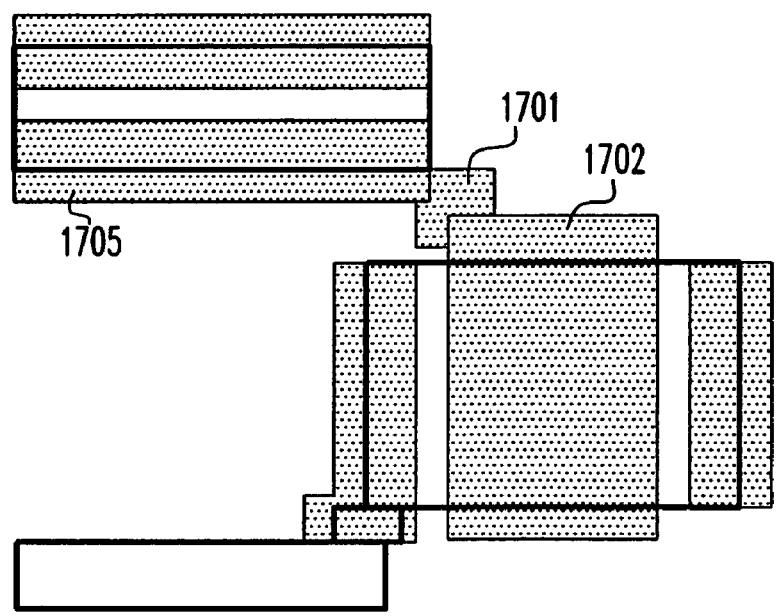

Thereafter, as shown in FIG. 17, the phase regions are legalized (step 1204) such that they are made to conform to rules regarding the minimum width of phase regions and the minimum spacing between adjacent phase regions. As a result of this step, an additional phase region 1701 is added between the phase regions 1702 and 1705 that existed from the previous step of generating the phase regions (FIG. 16). The additional phase region 1701 compensates for unwanted interaction between the phase regions 1702 and 1705 that are closer than the minimum spacing defined by the rule.

Figure 18:
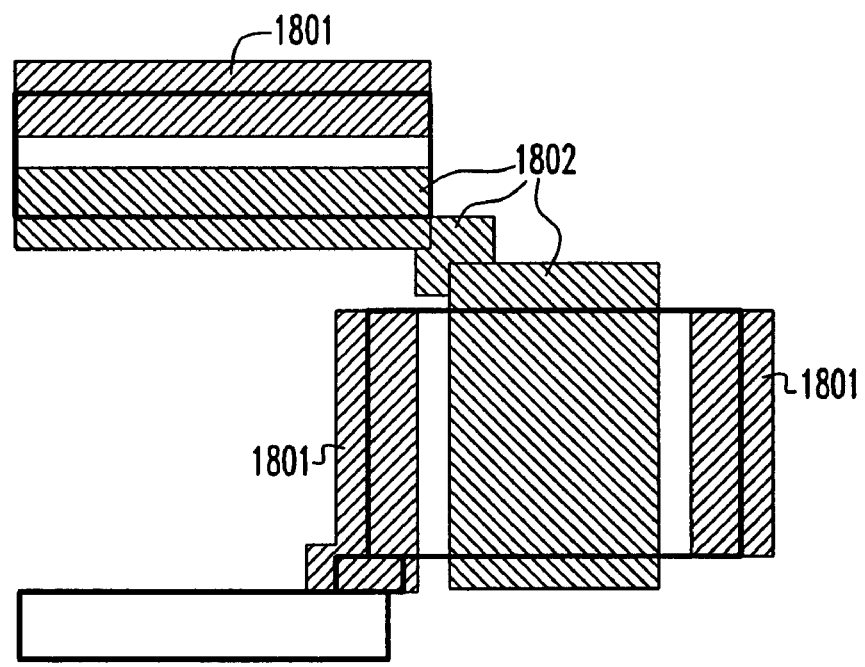

Next, as shown in FIG. 18, the generation and legalization of the phase regions are followed by the step (1205) of coloring the phase regions, i.e. designating the particular phase shift to be applied to particular phase regions of the altPSM mask. For example, as illustrated in FIG. 18, the phase regions 1801 are colored with a phase shift of zero degrees and other phase regions 1802 between the phase regions 1801 are colored with a phase shift of 180 degrees. These particular steps of generating, legalizing, and coloring the phase regions are performed in the embodiment in the same order as they are performed in the prior art method, as described above relative to FIG. 4. However, because the steps of designing and legalizing the block mask shapes have already been performed in the embodiment of the invention, while in the prior art method they are yet to be performed, the resultant mask patterns shown in FIG. 18 appear very different from those shown in the corresponding step of the prior art method illustrated in FIG. 7.

The embodiment of the invention shown in FIGS. 12 through 18 provides clear advantages over the prior art methods described above. Comparing the embodiment to the prior art method in the sequence of steps that are performed, it is clear that the method of the embodiment provides advantages. After coloring the phase regions, all of the block mask shapes of the trim mask have already been determined, and all of the phase-shifting regions of the altPSM mask and their coloring has been determined. Therefore, the last step (1209) of the method is to derive the data that represents all of the block mask shapes and phase-shifting region shapes for driving a mask patterning tool to fabricate the respective bright field block trim mask and dark field altPSM mask.

Notably, the embodiment of the invention differs here from the prior art method in that after the phase regions have been generated, legalized and colored, processing can generally proceed to deriving the final mask data, without requiring further checking or adjustments of the block mask shapes or the block mask shapes to be made in relation to the phase mask shapes. Thus, in the embodiment of the invention, the flow of generating both block mask shapes of the trim mask and the phase-shifting shapes of the altPSM mask is linear, not requiring the method to loop back iteratively, thereby saving much time and processing resources in generating the patterns of the masks.

As demonstrated in the embodiment here, the elimination of the necessity to perform another step followed by one or more additional steps to remodify and legalize the phase regions, as performed in the prior art methods, reduces both the amount of time and the costs of generating the patterns of the altPSM and block (trim) mask pair. The method of the embodiment of the invention described herein generates mask patterns which are as accurate, if not even more accurate, than the mask patterns which are generated using the prior art methods described in the background section above.

As performed in the embodiment of the invention, reversing the order of the generation of block mask shapes and phase-shifting shapes yields a lithographically optimized and logically correct altPSM layout. This improved method of generating mask patterns can be implemented to simplify the production of masks not only for producing VLSI-CMOS logic chips, but for implementing hierarchical shapes and manipulation tools that are used for memory circuits, preferably those designed to a groundrule of 90 nm or less, logic circuits, or other similar devices.

It should be noted that in an embodiment of the invention, a final check is made to determine whether a violation exists, as illustrated in step 1208 of FIG. 12. Therefore, if further adjustments need to be made, the present invention also provides for a mechanism to provide such modification. However, as seen and described above, since the design of the present invention provides a more accurate design at an earlier stage, even if modifications are needed to be made to the design of the present invention, the method of the present invention provides either a more accurate design or a design with the same degree of accuracy but at an earlier stage in processing, as compared to that provided by the prior art methods.

It should also be noted that the prior art method described above relative to FIGS. 4 through 11 cannot generate the required mask patterns to the same accuracy as in the invention, unless iterations are performed multiple times to adjust the generated phase regions to the block mask shapes and then legalize the phase regions, thereby starting the cycle all over again to generate and adjust new block mask regions after the adjusted phase regions are legalized.

As the methods described in the method embodiments of the invention are most preferably implemented as programs to be executed on a computer or other processor equipment, the programs by which the methods are implemented can be stored in one or more types of machine-readable media that are suited to transporting the program from one location to another.

Figure 19:
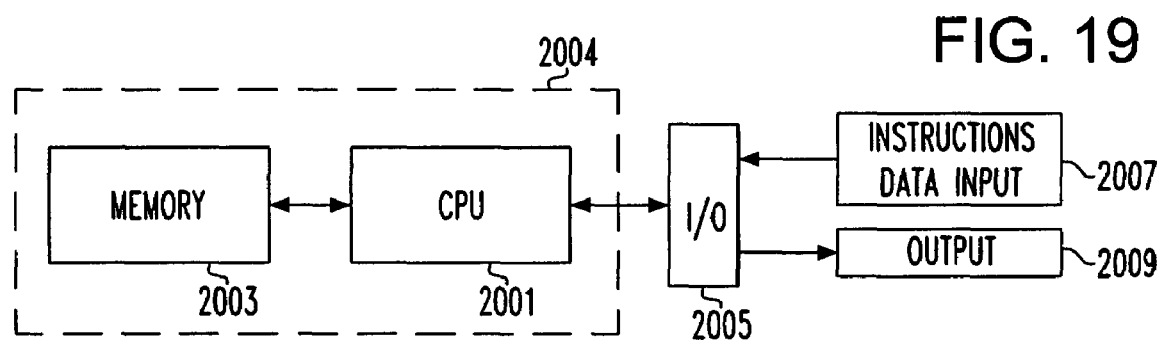
FIG. 19 is a diagram of a system embodiment of the invention operable to generate phase-shifting shapes and block shapes for inclusion in an altPSM mask and a block (trim) mask used therewith in a dual exposure altPSM lithography method.

FIG. 19 illustrates another embodiment of the invention in which a system is operable to produce patterns of a block mask and patterns of a phase-shifting mask according to the invention. As shown in FIG. 19, the system includes a processor 2004 including a central processor unit (CPU) 2001 and a memory (MEM) 2003, and an input output interface (IO) 2005, through which instructions and data input are received, and through which data output is transmitted. The memory can include only cache storage in the CPU, or it preferably includes additional memory, such as a main memory outside of the CPU, which may include only integrated circuit memory, or disk or tape drive media.

In the system embodiment of the invention, the input output interface IO 2005 is operable to receive data (2007) representing a circuit layout to be provided on a substrate. The processor 2004 is operable to identify critical segments of the circuit layout, and to generate and legalize block mask patterns based on the identified critical segments. The processor 2004 is further operable to generate and legalize phase mask patterns for use in conjunction with the legalized block mask patterns to produce masks which define an exposure pattern on the substrate. The processor is further operable to color the phase mask patterns to appropriate phases. The processor then outputs (2009) a data set through the IO 2005 which defines the patterns to be inscribed on a block mask and the patterns to be inscribed on a phase mask for a pair of a phase mask and a block (trim) mask for use according to a dual exposure altPSM technique.

While the invention has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A method of generating patterns of a paired set of photomasks from a data set defining a circuit layout to be provided on a substrate, comprising:
  inputting a circuit layout;
  identifying critical segments of said circuit layout;
  generating and legalizing block mask patterns based on said identified critical segments; and
    generating, legalizing and coloring phase mask patterns for use in a dual exposure method with said legalized block mask patterns, said phase mask patterns including pairs of juxtaposed etched regions in said phase mask, each region of each said pair having a pathlength difference of an odd number of half wavelengths relative to the other region of each said pair,
  wherein said legalized block mask patterns define a block mask and said colored legalized phase mask patterns define an alternating phase shift mask, said block mask and said alternating phase shift mask operable to be used together in a dual exposure method for patterning critical dimensioned features on said substrate.

2. The method of claim 1, wherein said method is performed using a processor.

3. The method of claim 2 further comprising generating data representing said legalized block mask patterns and said colored legalized phase mask patterns, and using said generated data to fabricate said block mask and said alternating phase shift mask, respectively.

4. The method of claim 3, further comprising checking for any violation of mask design rules prior to said step of generating said data.

5. The method of claim 4, further comprising modifying said circuit layout if there is a violation of said mask design rules, and performing again, in order, said steps of identifying critical segments, generating and legalizing block mask patterns, and generating, legalizing and coloring phase mask patterns.

6. A computer readable medium including a set of instructions recorded thereon for performing a method of generating patterns of a paired set of photomasks from a data set defining a circuit layout to provided on a substrate, said method comprising:

inputting a circuit layout;

identifying critical segments of said circuit layout;

generating and legalizing block mask patterns based on said identified critical segments; and generating, legalizing and coloring phase mask patterns for use in a dual exposure method with said legalized block mask patterns, said phase mask patterns including pairs of juxtaposed etched regions in said phase mask, each region of each said pair having a pathlength difference of an odd number of half wavelengths relative to the other region of each said pair, wherein said legalized block mask patterns define a block mask and said colored legalized phase mask patterns define an alternating phase shift mask, said block mask and said alternating phase shift mask operable to be used together in a dual exposure method for patterning critical dimensioned features on said substrate.

7. The computer readable medium of claim 6 wherein said method is adapted to be performed using a processor.

8. The computer readable medium of claim 7 wherein said method further comprises generating data representing said legalized block mask patterns and said colored legalized phase mask patterns, and using said generated data to fabricate said block mask and said alternating phase shift mask, respectively.

9. The computer readable medium of claim 8 wherein said method further comprises checking for any violation of mask design rules prior to said step of generating said data.

10. The computer readable medium of claim 9 wherein said method further comprises modifying said circuit layout if there is a violation of said mask design rules, and performing again, in order, said steps of identifying critical segments, generating and legalizing block mask patterns, and generating, legalizing and coloring phase mask patterns.

11. An apparatus for generating patterns of a paired set of photomasks from a data set defining a circuit layout to be provided on a substrate, comprising:

a processor; and an input output (IO) interface connected to said processor, said processor being operable to input a circuit layout over said IO interface, to identity critical segments of said circuit layout, to generate and legalize block mask patterns based on said identified critical segments, and to thereafter generate, legalize and color phase mask patterns for use in a dual exposure method with said legalized block mask patterns, said phase mask patterns including pairs of juxtaposed etched regions in said phase mask, each region of each said pair having a pathlength difference of an odd number of half wavelengths relative to the other region of each said pair, wherein said legalized block mask patterns define a block mask and said colored legalized phase mask patterns define an alternating phase shift mask, said block mask and said alternating phase shift mask operable to be used together in a dual exposure method for patterning critical dimensioned features on said substrate.

12. The apparatus of claim 11, wherein said processor is further operable to generate data representing said legalized block mask patterns and said colored legalized phase mask patterns for use in fabricating said block mask and said alternating phase shift mask, respectively.

13. The apparatus of claim 12, wherein said processor is further operable to check for any violation of mask design rules prior to generating said data.

14. The apparatus of claim 13, further wherein said processor is further operable to modify said circuit layout if there is a violation of said mask design rules, and to identify critical segments, generate and legalize block mask patterns, and generate, legalize and color phase mask patterns again, in order.

* * * * *